(12) United States Patent
Sato (10) Patent No.: US 9,837,338 B2
(45) Date of Patent: Dec. 5, 2017

(54) SEMICONDUCTOR MODULE WITH MOUNTING CASE AND METHOD FOR MANUFACTURING THE SAME

(71) Applicant: FUJI ELECTRIC CO., LTD., Kawasaki-shi, Kanagawa (JP)

(72) Inventor: Tadahiko Sato, Matsumoto (JP)

(73) Assignee: FUJI ELECTRIC CO., LTD., Kawasaki-Shi, Kanagawa (JP)

( * ) Notice: Subject to any disclaimer, the term of this patent is extended or adjusted under 35 U.S.C. 154(b) by 0 days.

(21) Appl. No.: 15/151,453

(22) Filed: May 10, 2016

(65) Prior Publication Data

US 2016/0254215 A1    Sep. 1, 2016

Related U.S. Application Data

(63) Continuation of application No. PCT/JP2015/055066, filed on Feb. 23, 2015.

(30) Foreign Application Priority Data

Apr. 30, 2014   (JP) ................................ 2014-093422

(51) Int. Cl.
*H01L 23/495* (2006.01)
*H01L 23/057* (2006.01)
*H01L 25/07* (2006.01)
*H01L 21/48* (2006.01)
*H01L 21/52* (2006.01)
*H01L 21/56* (2006.01)
(Continued)

(52) U.S. Cl.
CPC .... *H01L 23/49541* (2013.01); *H01L 21/4825* (2013.01); *H01L 21/4871* (2013.01);
(Continued)

(58) Field of Classification Search
CPC .................... H01L 21/4825; H01L 121/4871; H01L 21/52
See application file for complete search history.

(56) References Cited

U.S. PATENT DOCUMENTS 5,122,858 A * 6/1992 Mahulikar .......... H01L 23/3142
257/729
5,689,089 A   11/1997 Polak et al.
(Continued)

FOREIGN PATENT DOCUMENTS

JP   H03-178151 A   8/1991
JP     3021070 U    2/1996
(Continued)

OTHER PUBLICATIONS

Japanese Office Action dated Jul. 25, 2017, and its English translation.

*Primary Examiner* — Olik Chaudhuri
*Assistant Examiner* — Wilmer Jean Baptiste
(74) *Attorney, Agent, or Firm* — Rabin & Berdo, P.C.

(57) ABSTRACT

A terminal case formed by integrally molding a lead frame and a case that has internally an inner face on which the lead frame is mounted and has externally a step portion fixed to a circuit block having an insulating substrate and semiconductor chips formed on the insulating substrate. An opening portion is formed between the step portion and the inner face so as to extend through them, and the opening portion is filled with an adhesive to bond the insulating substrate to the step portion. Since a connecting area to which a bonding wire of the lead frame is ultrasonically bonded is fixed, it is possible to reduce the bonding failures of the lead frames.

7 Claims, 7 Drawing Sheets

(51) Int. Cl.
*H01L 23/04* (2006.01)
*H01L 23/31* (2006.01)
*H01L 23/00* (2006.01)
*H01L 25/18* (2006.01)

(52) U.S. Cl.
CPC ............ H01L 21/52 (2013.01); H01L 21/565 (2013.01); H01L 23/04 (2013.01); H01L 23/057 (2013.01); H01L 23/3142 (2013.01); H01L 23/4952 (2013.01); H01L 23/49506 (2013.01); H01L 24/85 (2013.01); H01L 25/072 (2013.01); H01L 25/18 (2013.01); H01L 2224/32225 (2013.01); H01L 2224/32245 (2013.01); H01L 2224/48137 (2013.01); H01L 2224/48139 (2013.01); H01L 2224/48247 (2013.01); H01L 2224/48472 (2013.01); H01L 2224/4903 (2013.01); H01L 2224/49171 (2013.01); H01L 2224/73265 (2013.01); H01L 2224/85205 (2013.01); H01L 2224/92247 (2013.01); H01L 2924/13055 (2013.01); H01L 2924/13091 (2013.01); H01L 2924/14 (2013.01); H01L 2924/181 (2013.01); H01L 2924/19107 (2013.01)

(56) References Cited

U.S. PATENT DOCUMENTS 6,084,310 A * 7/2000 Mizuno ................ H01L 21/565
257/692
2001/0023983 A1 * 9/2001 Kobayashi ........ H01L 23/49894
257/698
2003/0085456 A1 * 5/2003 Lee ........................ H01L 23/049
257/686
2004/0011699 A1 1/2004 Park
2005/0258550 A1 * 11/2005 Morita ................ H01L 21/4871
257/784
2006/0023431 A1 2/2006 Wetzel
2007/0257343 A1 * 11/2007 Hauenstein ........... H01L 23/049
257/676
2009/0179317 A1 * 7/2009 Iida ..................... B81C 1/00238
257/685
2012/0001309 A1 1/2012 Soyano
2014/0374889 A1 12/2014 Denta et al.
2015/0371931 A1 12/2015 Nishida et al.

FOREIGN PATENT DOCUMENTS

| JP | 2000-500928 A | 1/2000 |
| JP | 2000-138342 A | 5/2000 |
| JP | 2004-505450 A | 2/2004 |
| JP | 2004-134518 A | 4/2004 |
| JP | 2006-515115 A | 5/2006 |
| JP | 2012-015349 A | 1/2012 |
| JP | 2013-258321 A | 12/2013 |
| WO | WO-98/12743 A1 | 3/1998 |
| WO | WO 2000-28589 A1 | 5/2000 |
| WO | WO-02/09180 | 1/2002 |
| WO | WO-2005/025940 A1 | 3/2005 |
| WO | WO-2014/199764 A1 | 12/2014 |

* cited by examiner

SEMICONDUCTOR MODULE WITH MOUNTING CASE AND METHOD FOR MANUFACTURING THE SAME

CROSS-REFERENCE TO RELATED APPLICATION

This application is a continuation application of International Application PCT/JP2015/055066 filed on Feb. 23, 2015 which designated the U.S., which claims priority to Japanese Patent Application No. 2014-093422, filed on Apr. 30, 2014, the entire contents of which are incorporated herein by reference.

BACKGROUND OF THE INVENTION

1. Field of the Invention

Embodiments discussed herein relate to a semiconductor module and a method for manufacturing the same. In particular, they relate to a semiconductor module used in applications including an inverter device, such as a motor drive device, and a power conversion device, such as a switching power supply device, and to the method for manufacturing the same.

2. Background of the Related Art

In a semiconductor module for power conversion, a plurality of semiconductor chips for power, such as power transistors or diodes for power conversion, is integrated into one package. In such a semiconductor module, circuit wiring suitable for a desired application is performed in advance inside a package, thereby contributing to miniaturization of the whole application device. In the semiconductor module for power conversion, a MOSFET (Metal Oxide Semiconductor Field-Effect Transistor) or an IGBT (Insulated-Gate Bipolar Transistor) is generally used as a power transistor.

An element for power conversion is configured so as to be exposed to the outside of a semiconductor module via a copper foil surface on an insulating substrate and via the insulating substrate, in order to reduce by heat radiation the heat generated by the power loss of the element. Here, the heat radiation is performed from the exposed surface using a radiator (e.g., see Japanese Laid-open Patent Publication No. 2013-258321 (Paragraph [0043], FIG. 2)). That is, in this Japanese Laid-open Patent Publication No. 2013-258321, an insulating layer is arranged in the surface of a thermally-conductive metal plate, a main circuit wiring pattern is formed on the insulating layer, and a semiconductor chip is bonded onto the main circuit wiring pattern. The heat generated by this semiconductor chip is transferred to the metal plate via the main circuit wiring pattern and the insulating layer, and is radiated by a heat sink bonded to this metal plate.

Moreover, in the element for power conversion, a desired circuit is formed from a lead frame, a conductive wire, and/or a wiring pattern formed on a substrate, and the circuit is directly connected or indirectly connected via a wire or the like, to a terminal which is the means for electrically connecting to the outside.

Furthermore, a module called IPM (Intelligent Power Module) which is a semiconductor module having a control IC (integrated circuit) mounted thereon has been commercialized and widely used. The control IC has a driver function to drive the element for power conversion and a function to detect abnormal states of the element, such as overcurrent, and protect the element. Since the control IC generates a small amount of heat, and in order to avoid the noise of the element for power conversion, the control IC is mounted at a position away from the substrate on which the element for power conversion is mounted. In Japanese Laid-open Patent Publication No. 2013-258321, the control IC is mounted on a wiring pattern formed inside a case.

Moreover, in the IPM, there is also a module having mounted therein a current detection element, a temperature detection element, a snubber element, and/or passive components, such as a capacitor connected to supply a stable electric power to the control IC. The semiconductor module having these elements mounted therein and having a desired electric connection made therein is resin-sealed to complete the IPM.

For example, in the IPM disclosed in Japanese Laid-open Patent Publication No. 2013-258321, elements for power conversion, such as an IGBT and an FWD (Free Wheeling Diode), are mounted, by soldering, onto an insulating substrate in which a wiring pattern is formed in advance. In a terminal case holding this insulating substrate, a lead frame and a PPS resin (Polyphenylene Sulfide Resin) are integrated by insert molding. The terminal case is molded by injecting the PPS resin into a mold which is fixed and set by a fixing pin that is placed so that the lead frame may neither displace nor deform due to a resin pressure during molding, or a fixing pin such as an ejector pin, but an opening portion formed at that time (hole by the fixing pin) is sealed with the resin by moving the fixing pin during molding. In the terminal case, elements, such as a control IC, are mounted on a lead terminal with an adhesion means, such as an Ag (gold) paste. Subsequently, the insulating substrate is bonded to the terminal case with an adhesive, electrical connection (ultrasonic bonding) is made using an aluminum wire so as to form a desired circuit across the element, the wiring pattern of the insulating substrate, and the lead frame, and then the terminal case is sealed with a cast resin so as to constitute a semiconductor module.

It is known that a bonding defect may be caused in ultrasonically bonding a bonding wire to a lead terminal (e.g., see Japanese Laid-open Patent Publication No. 2004-134518 (Paragraphs [0048]-[0056], FIGS. 4 to 7)). According to this Japanese Laid-open Patent Publication No. 2004-134518, in manufacturing a terminal case, due to a difference in the linear expansion coefficient between a resin and a metal lead terminal, a lead terminal closely attached to the terminal case may depart from the case when a high-temperature resin gets cold. Moreover, because there is no adhesive force between the lead terminal and the PPS resin, a very small gap will be produced between the both even if the both are formed so as to be closely attached to each other. In a state where a lead terminal is floating from the case, in attempting to ultrasonically bond a bonding wire to the lead terminal, the ultrasonic vibration energy will be absorbed by the lead terminal, which causes a bonding defect.

In contrast, in Japanese Laid-open Patent Publication No. 2004-134518, a through-hole is formed in a case directly under an ultrasonic bonding portion of a terminal plate serving as a lead terminal, and a support member insertion port is formed, also in a heat sink bonded to the case, at the position corresponding to the through-hole. In ultrasonically bonding a bonding wire, the bonding wire is ultrasonically bonded to the upper surface of the terminal plate using a rod-like tool while the lower surface of the ultrasonic bonding portion of the terminal plate is supported with the fixing pins arranged in the support member insertion port and the through-hole. Note that, because the terminal plate faces the through-hole, the lower surface of the terminal plate is exposed to the air to improve the radiation performance.

Moreover, in Japanese Laid-open Patent Publication No. 2004-134518, in the lower surface of a frame-shaped case made of an insulating resin and having an opening formed in the center portion thereof, a plate-like heat sink formed from a thermally conductive metal is arranged so as to plug the opening with the heat sink. Although an adhesive is used in bonding such a resin and metal, if the adhesive is excessively applied more than needed, then a high bonding strength may be obtained but the adhesive may protrude from the bonding area. The adhesive flowing out to the outside of the case will deteriorate the appearance of the case, and furthermore the adhesive flowing into the case will contaminate the bonding portion formed by ultrasonic bonding and reduce the bonding strength.

As a method for suppressing such protrusion of the adhesive, there is known a method in which a plurality of grooves is formed in the surface facing the heat sink of a case, among the plurality of grooves, a groove in the vicinity of the center is used as the adhesive application groove, and the outer and inner grooves are used as the adhesive outflow prevention grooves (e.g., see Japanese Laid-open Patent Publication No. 2012-15349 (FIG. 1)). Thus, even if the adhesive protrudes from the adhesive application groove, the adhesive is accommodated into the adhesive outflow prevention groove, thus preventing the adhesive from flowing out beyond the adhesive outflow prevention groove.

The conventional semiconductor module has a problem that the equipment cost increases because when a bonding wire is ultrasonically bonded to a lead frame, a pin-like pressing jig is needed for pressing the face opposite to an ultrasonic bonding face and in addition the pressing jig is complicated. Moreover, there is also a problem that the manufacturing throughput decreases because the pressing jig needs to be attached and detached in ultrasonic bonding and thus the attachment and detachment take a time.

SUMMARY OF THE INVENTION

According to one aspect of the embodiments, there is provided a semiconductor module including: a lead frame with a connecting area to which a bonding wire is ultrasonically bonded; and a case having internally a mounting face on which the lead frame is mounted, having externally a fixing face to which a circuit block having a semiconductor chip formed on an insulating substrate is fixed, and having an opening portion which is formed so as to extend through between the mounting face and the fixing face, wherein the opening portion is filled with an adhesive to bond the circuit block and a portion near the connecting area of the lead frame.

The object and advantages of the invention will be realized and attained by means of the elements and combinations particularly pointed out in the claims.

It is to be understood that both the foregoing general description and the following detailed description are exemplary and explanatory and are not restrictive of the invention.

DETAILED DESCRIPTION OF THE INVENTION

Hereinafter, embodiments of a semiconductor module according one aspect will be described in detail with reference to the accompanying drawings. Note that, in the drawing used for description of the following embodiments, the same constituent element is given the same reference numeral to omit the duplicated description.

Figure 1:
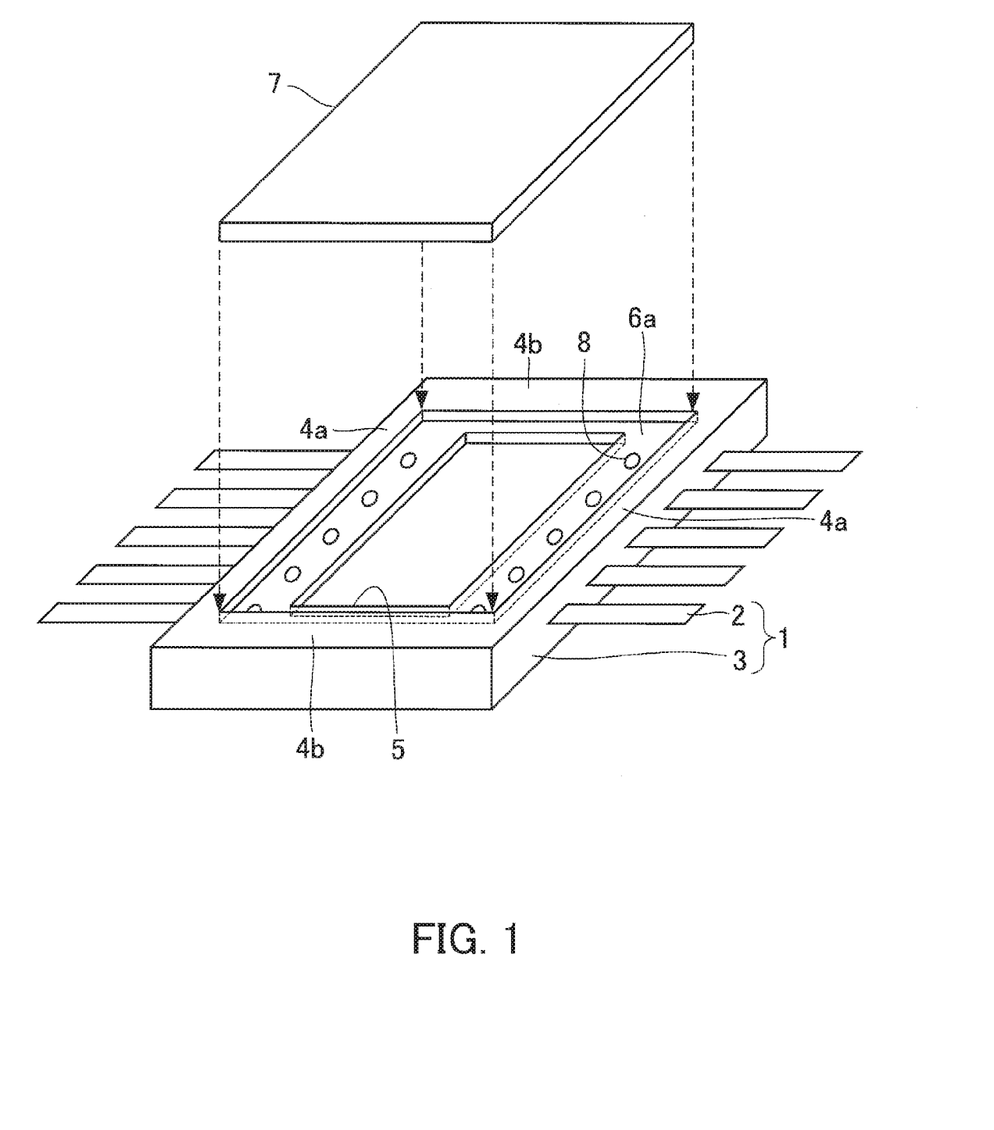
FIG. 1 is an exploded perspective view of a semiconductor module according to an embodiment discussed herein when seen from the bottom-face side of the semiconductor module.
Figure 2:
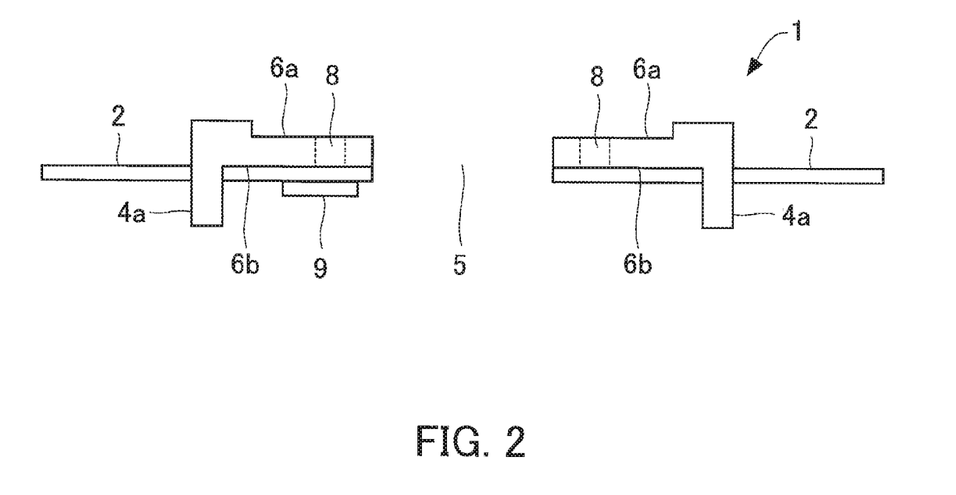
FIG. 2 is a cross sectional view illustrating the semiconductor module in an upside down state before mounting of an insulating substrate.
Figure 3:
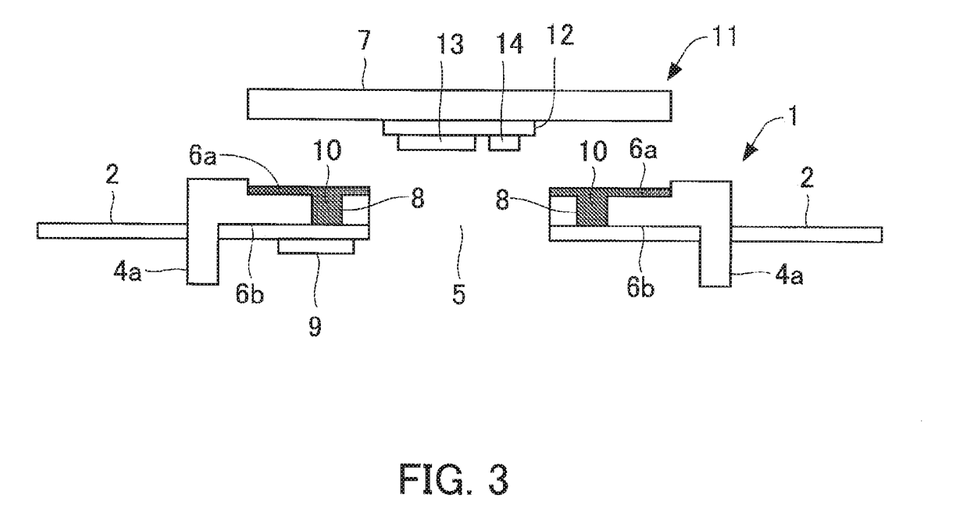
FIG. 3 is a cross sectional view illustrating the semiconductor module at mounting of the insulating substrate.
Figure 4:
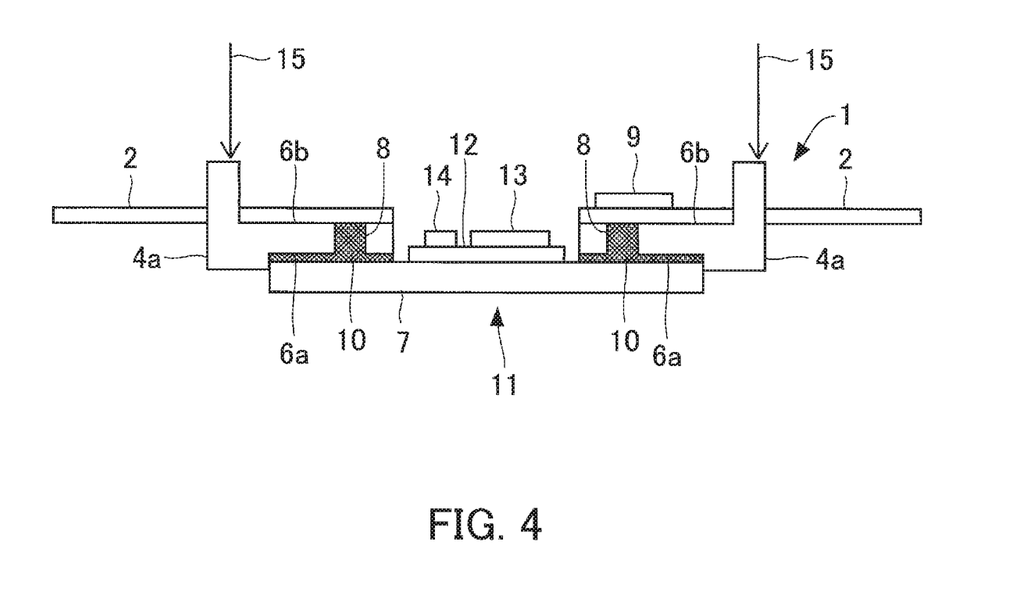
FIG. 4 is a cross sectional view illustrating the semiconductor module when wiring with a bonding wire is performed.
Figure 5:
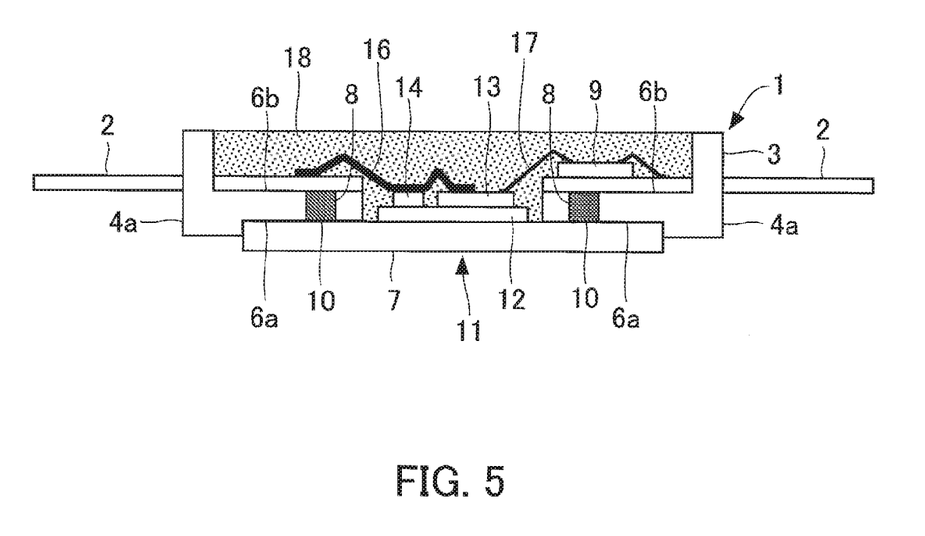
FIG. 5 is a cross sectional view illustrating the semiconductor module after resin sealing.

FIG. 1 is an exploded perspective view of a semiconductor module according to an embodiment discussed herein when seen from the bottom-face side of the semiconductor module, FIG. 2 is a cross sectional view illustrating the semiconductor module in an upside down state before mounting of an insulating substrate, FIG. 3 is a cross sectional view illustrating the semiconductor module at mounting of the insulating substrate, FIG. 4 is a cross sectional view illustrating the semiconductor module when wiring with a bonding wire is performed, and FIG. 5 is a cross sectional view illustrating the semiconductor module after resin sealing.

The semiconductor module according to the embodiment discussed herein includes a terminal case 1 as seen in FIG. 1 that illustrates the outline before assembling of the semiconductor module. The terminal case 1 is formed by integrally molding a lead frame 2 and a case 3 (by insert-molding a lead frame). The terminal case 1 includes a pair of opposed parallel sidewall portions 4a having the lead frame 2 inserted thereinto and a pair of opposed parallel sidewall portions 4b connected to the both ends in the longer direction of the sidewall portion 4a, and is formed in a rectangular frame shape in a plan view. The sidewall portions 4a and 4b of the terminal case 1 each have an L-shaped cross section. In the bottom face (the upper surface in FIG. 1) of the terminal case 1, a step portion 6a is formed along the periphery of a center opening portion 5. The step portion 6a of the sidewall portions 4a and 4b is a fixing face to which an insulating substrate 7 is fixed, and has a depth thinner than the thickness of the insulating substrate 7.

In the terminal case 1, also as illustrated in FIG. 2, the inner side of the lead frame 2 is mounted on an inner face 6b which is the mounting face located on the opposite side of the step portion 6a and the outer side of the lead frame 2 extends outward through the sidewall portion 4a. In the lead frame 2, the opposite side of a face mounted on the inner face 6b of the case 3 serves as the connecting area by ultrasonic bonding.

Here, in the inner face 6b having the lead frame 2 mounted thereon of the terminal case 1, an opening portion 8 extending through to the step portion 6a is formed. That is, in a case portion in which the step portion 6a is formed, the lead frame 2 and a connecting area of the insulating substrate 7 are located on the upper side and lower side of the opening portion 8, respectively. The opening portion 8 is formed in a case portion directly under the connecting area of the lead frame 2, i.e., in a case portion near a portion where wire bonding is performed by ultrasonic bonding. Note that, the portion where wire bonding is performed by ultrasonic bonding is also a portion through which a main current of the lead frame 2 flows. Furthermore, the opening portion 8 may be, as needed, formed also in a portion where the lead frame 2 is arranged but ultrasonic bonding is not performed, for the purpose of fixing the lead frame 2 to the insulating substrate 7.

The opening portion 8 is formed during insert molding of the lead frame. That is, in setting the pre-molded lead frame 2 to a mold, an ejector pin is installed in advance so as to support the lead frame 2. In this state, a PPS resin, for example, is injected into the mold to mold the terminal case 1. Here, because the resin filling the mold will be solidified without moving of the ejector pin, the resin will not turn around to the ejector pin. Subsequently, the terminal case 1 is pushed out from the mold by means of the ejector pin, and furthermore the ejector pin is pulled out from the terminal case 1 so as to form the opening portion 8.

The opening portion 8 may be also formed by a so-called pressing pin which is used to prevent twisting and/or displacement of the lead frame 2 during insert molding, or may be formed using both the ejector pin and the pressing pin.

Next, a procedure for constructing a semiconductor module using the terminal case 1 that is formed in this manner will be described. First, in the terminal case 1, depending on the application and/or the purpose, a control IC, and passive elements, such as a capacitor and a resistor, are placed on the lead frame 2 which serves also as a circuit. FIG. 2 illustrates an example in which a control IC 9 is placed on the lead frame 2.

The terminal case 1 having the control IC 9 placed on the lead frame 2 is turned upside down as illustrated in FIG. 2, and next as illustrated in FIG. 3 an adhesive 10 is applied to the step portion 6a to which the insulating substrate 7 is fixed. As the adhesive 10, a resin having a thermal conductivity (e.g., 0.5 (W/mK)) higher than the thermal conductivity (e.g., 0.3 (W/mK)) of a PPS resin constituting the case 3 is used. The adhesive 10 is not only applied to the surface of the step portion 6a but fills the opening portion 8. Thus, in the lead frame 2, the portions facing the opening portion 8 will be bonded with the adhesive 10.

Next, in the terminal case 1, as illustrated in FIG. 3, the insulating substrate 7 is placed onto the step portion 6a applied with the adhesive 10. The insulating substrate 7 may be an Al (aluminum) insulating substrate or a DCB (Direct Copper Bonding) substrate, in which semiconductor chips 13 and 14 for power are mounted on a conductive wiring pattern 12, which is formed in advance in the surface, to constitute a circuit block 11. These semiconductor chips 13 and 14 are assumed to be an IGBT and an FWD, here.

The circuit block 11 is placed onto the step portion 6a, with the mounting faces of the semiconductor chips 13 and 14 set downward, so that the outer peripheral portion of the insulating substrate 7 is not only bonded to the terminal case 1 with the adhesive 10 but also is bonded to the lead frame 2 with the adhesive 10 of the opening portion 8. Thus, the lead frame 2 will be not only secured to the insulating substrate 7 with the adhesive 10 that fills the opening portion 8 directly thereunder but will be thermally coupled with the insulating substrate 7 via the adhesive 10.

Because the lead frame 2 is secured to the insulating substrate 7 via the opening portion 8 and a vicinity of a portion where wire bonding is performed is fixed, a complicated pressing jig is not needed during ultrasonic bonding and in addition a bonding defect will not be caused.

Moreover, because the lead frame 2 is thermally coupled with the insulating substrate 7 via the opening portion 8, the lead frame 2 may transfer the heat generated by the main current flowing, to the insulating substrate 7, allowing for heat radiation of the lead terminal. Thus, the radiation performance of the lead frame 2 may be further improved as compared with the conventional example in which a lead frame is exposed to the air whose thermal conductivity is 0.0241 (W/mK) through a support member insertion port and an opening portion serving as a through-hole.

Here, when the control IC 9 placed on the lead frame 2 has a temperature protection function and/or a temperature output function, the control IC 9 may precisely protect the semiconductor chips 13 and 14. That is, the thermal resistance between the insulating substrate 7 to which the semiconductor chips 13 and 14 are connected with a low thermal resistance and the lead frame 2 on which the control IC 9 is placed is further reduced as compared with the conventional example in which the lead frame 2 is exposed to the air. Therefore, the thermal resistance between the semiconductor chips 13 and 14 and the control IC 9 decreases and accordingly the control IC 9 may more accurately detect the temperature, allowing for accurate protection of the semiconductor chips 13 and 14.

Next, the terminal case 1 to which the circuit block 11 is secured is rotated by 180 degrees as illustrated in FIG. 4, and the inner face 6b of the terminal case 1 and the mounting faces of the semiconductor chips 13 and 14 of the circuit block 11 are faced up. Here, the terminal case 1 is ready to be wire-bonded as the upper end face thereof is pressed in the direction indicated by an arrow 15. Thus, as compared with a conventional example in which during ultrasonic bonding a lead frame floating from a case needs to be pressed down for each portion where wire bonding is performed, a pressing jig with simple configuration may be used.

In this state, in the semiconductor module, wire bonding is performed using a bonding wire 16 of a main circuit and a bonding wire 17 of the control circuit as illustrated in FIG. 5. Here, the interface between the inner face 6b of the terminal case 1 and the lead frame 2 is cohesive, and therefore in ultrasonically bonding the bonding wire 16 to the lead frame 2, an ultrasonic vibration energy may be reliably transferred without being absorbed. Moreover, wire bonding of the bonding wire 16 to the semiconductor chips 13 and 14 and wire bonding of the bonding wire 17 to the semiconductor chip 13, control IC 9, and lead frame 2 are also performed.

Then, in the semiconductor module, as illustrated in FIG. 5, the terminal case 1 is filled with a liquid cast resin 18 to resin-seal the semiconductor chips 13 and 14 and control IC 9. The cast resin 18 may be the same resin as the adhesive 10 for bonding the insulating substrate 7 of the circuit block 11 to the terminal case 1. Use of the same material for the cast resin 18 and adhesive 10 achieves common use of a member.

Next, a specific example of the process of manufacturing the semiconductor module will be described.

Figure 6:
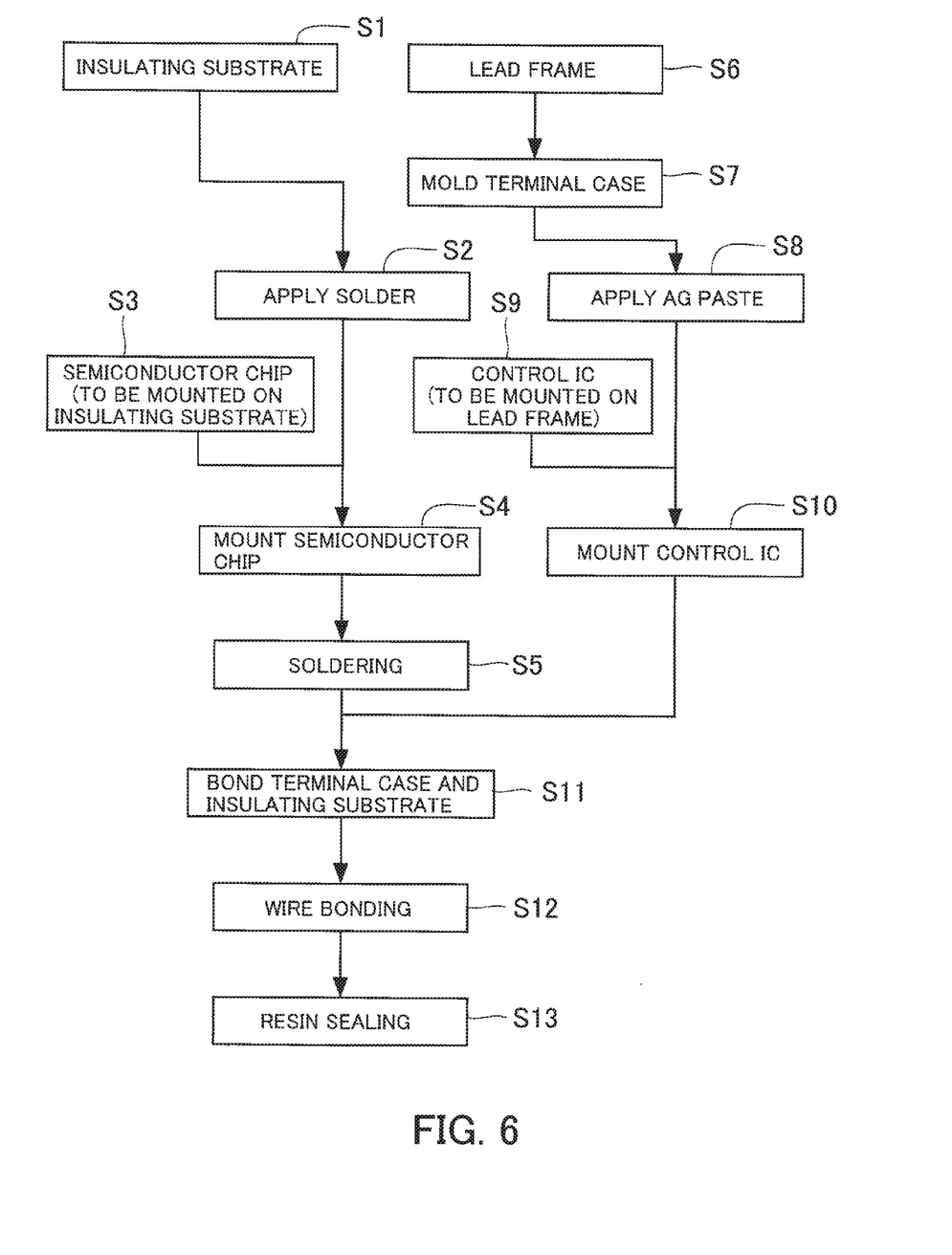
FIG. 6 is a flow chart illustrating a method for manufacturing the semiconductor module.
Figure 7:
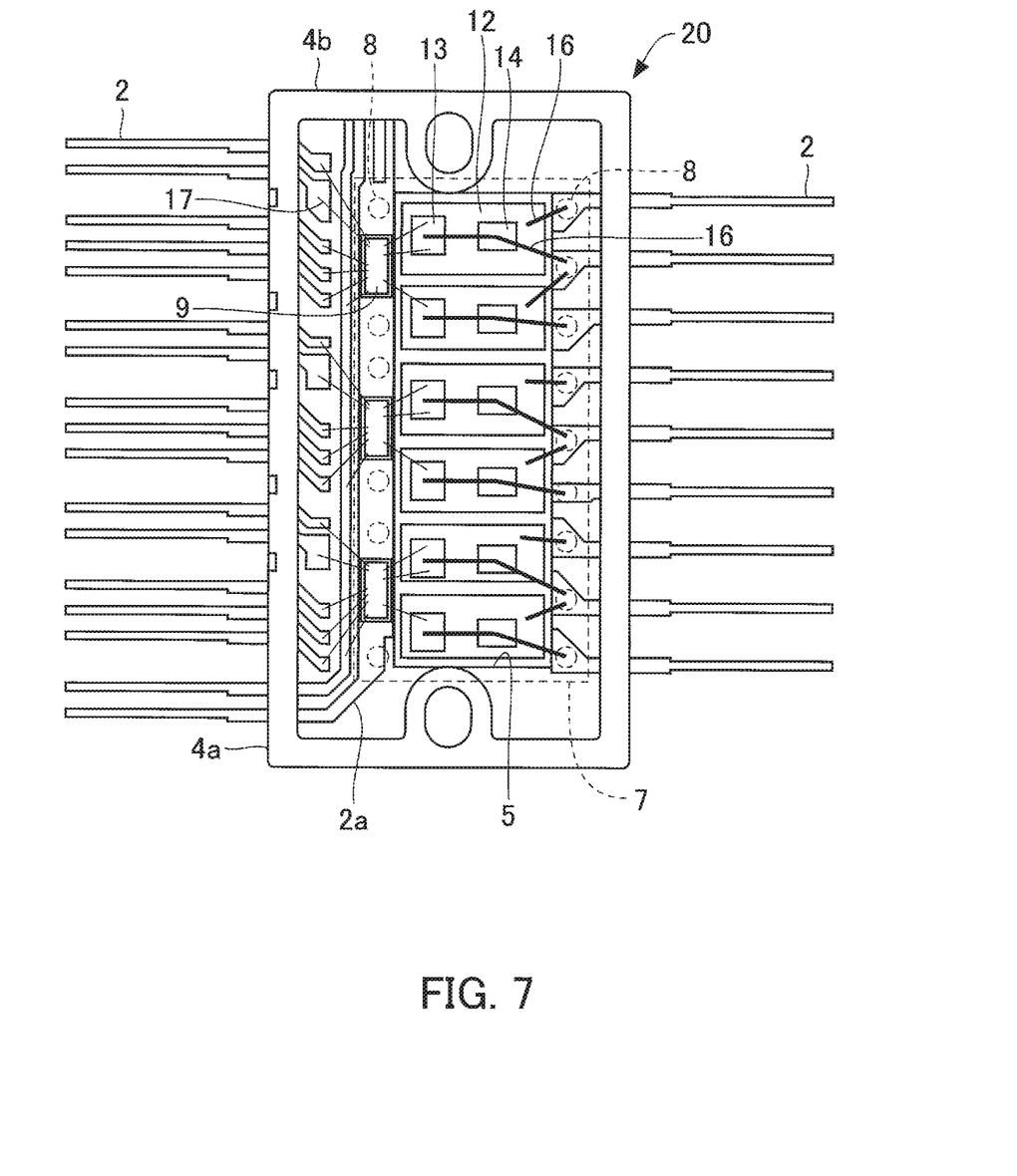
FIG. 7 illustrates a specific example of the semiconductor module.

FIG. 6 is a flow chart illustrating a method for manufacturing the semiconductor module, and FIG. 7 illustrates a specific example of the semiconductor module.

In manufacturing the semiconductor module, the circuit block 11 and the terminal case 1 are prepared in separate steps in advance, respectively, as illustrated in FIG. 6. First, the insulating substrate 7 is prepared (step S1) for the circuit block 11, a solder is applied to one of the faces of the insulating substrate 7 (step S2). Next, the semiconductor chips 13 and 14 serving as an IGBT and an FWD are prepared (step S3). These semiconductor chips 13 and 14 are mounted onto the solder applied to the insulating substrate 7 (step S4), and then put into a reflow furnace and soldered to form the circuit block 11 (step S5).

On the other hand, with regard to the terminal case 1, first the pre-molded lead frame 2 is prepared (step S6), the lead frame 2 is set to a mold of an injection molding machine, and then a PPS resin is injected into the mold to mold the terminal case 1 (step S7). Here, in the terminal case 1, the opening portion 8 is formed using an ejector pin or pressing pin. Next, a thermoset Ag paste, for example, is applied to a control IC mounting position of the lead frame 2 in the terminal case 1 (step S8). Next, the control IC 9 is prepared (step S9), and the control IC 9 is mounted on the Ag paste and fixed to the lead frame 2 (step S10).

Next, the terminal case 1 having the control IC 9 mounted on the lead frame 2 is turned upside down (see FIG. 2), and the adhesive 10 is applied to the step portion 6a formed around the center opening portion 5 of the terminal case 1. Next, the insulating substrate 7 with the mounting faces of the semiconductor chips 13 and 14 set downward is mounted on the step portion 6a, thereby bonding the terminal case 1 and the insulating substrate 7 (step S11). In the bonding step, because the same operations/equipment as the conventional operations/equipment used in bonding the terminal case and the insulating substrate may be used, no additional equipment or cycle time is needed, and therefore no extra cost incurs.

Next, the terminal case 1 is turned upside down to face up the mounting faces of the semiconductor chips 13 and 14 of the insulating substrate 7 and the control IC mounting face of the lead frame 2, and then wire bonding with the bonding wires 16 and 17 is performed (step S12).

Next, the terminal case 1 is filled with the cast resin 18 being a PPS resin to resin-seal the terminal case 1 (step S13).

A specific example of the semiconductor module manufactured through the above steps will be described. A semiconductor module 20 illustrated in FIG. 7 is the one when seen from the upper surface of a case 3 before resin sealing. In the semiconductor module 20, six wiring patterns 12 are formed in the insulating substrate 7 of the circuit block 11, and the semiconductor chip 13 as an IGBT and the semiconductor chip 14 as an FWD are mounted on each of the wiring patterns 12. Moreover, three control ICs 9 are mounted on a lead frame 2a serving as an internal interconnection.

Here, the wiring pattern 12 or semiconductor chips 13 and 14 and the lead frame 2 serving as the lead terminal are connected by the bonding wire 16, and the opening portion 8 is formed directly under a portion near a portion of the lead frame 2 to which the bonding wire 16 is bonded. Thus, the lead frame 2 is fixed to the insulating substrate 7 with the adhesive 10 near a portion to which the bonding wire 16 is bonded. Accordingly, in ultrasonically bonding the bonding wire 16 to the connecting area of the lead frame 2, a bonding failure due to flapping of the lead frame 2 will not be caused. Moreover, because the thermal conductivity of the adhesive 10 is higher than the thermal conductivity of the case 3, the heat generated by the main current flowing into the lead frame 2 is transferred to the insulating substrate 7 via the adhesive 10, the radiation performance of the lead frame 2 will be improved.

On the other hand, the opening portion 8 formed directly under the lead frame 2a is to be filled with the adhesive 10 to fix the lead frame 2a to the insulating substrate 7. While the both ends of the lead frame 2a are fixed by the sidewall portions 4a and 4b of the case 3, the intermediate portion of the lead frame 2a is fixed to the insulating substrate 7 by the adhesive 10, so that the lead frame 2a is more firmly fixed to the case 3.

Moreover, the adhesive 10 having a higher adhesion to the lead frame 2 rather than to the case 3 is more preferable. Thus, when a gap is produced between the case and the lead frame 2 due to a difference in linear expansion coefficient, the lead frame 2 and the insulating substrates 7 may be firmly and closely attached to each other and thus the radiation performance will be improved.

Note that, the embodiments are not limited to the above-described configurations but may be appropriately combined and configured as needed.

The embodiments described above simply illustrate the principle of the present invention. Furthermore, many variants and modifications are possible for those skilled in the art, the present invention is not limited to the precise configurations and exemplary applications illustrated and described above, and all the corresponding variants and equivalents are construed to be within the scope of the appended claims and their equivalents.

The semiconductor module having the above-described configuration and method for manufacturing the same have an advantage that the productivity (wire bondability) may be improved because a portion near the connecting area of the lead frame may be fixed without changing the conventional step and/or adding any step to the conventional step.

Because the lead frame is bonded to the insulating substrate with an adhesive having a high thermal conductivity, the thermal resistance between the insulating substrate and the lead frame is reduced and thus the radiation performance of the lead frame may be further improved.

Furthermore, if a control IC placed on the lead frame has a temperature protection function and/or a temperature output function, the thermal resistance between the insulating substrate to which a semiconductor chip is connected with a low thermal resistance and the lead frame on which the control IC is placed will also decrease. Therefore, the thermal resistance between the semiconductor chip and the control IC will also decrease, and thus the control IC may more accurately detect the temperature, allowing for accurate protection of the semiconductor chip.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that various changes, substitutions, and alterations could be made hereto without departing from the spirit and scope of the invention.

What is claimed is:

1. A semiconductor module comprising:
a bonding wire;
a lead frame having a connecting area to which the bonding wire is bonded;
a circuit block including an insulating substrate, and a semiconductor chip formed on the insulating substrate;
a case having an internal mounting face on which the lead frame is mounted, and an external fixing face to which the circuit block is fixed, the case defining a first opening in which the semiconductor chip is located based on the insulating substrate being mounted to the external fixing face and defining at least one second opening spaced apart from the first opening and extending through the case between the mounting face and the fixing face; and an adhesive filling the at least one second opening so as to bond the circuit block to the lead frame.

2. The semiconductor module according to claim 1, wherein the at least one second opening is located under the connecting area of the lead frame, and wherein the case has an additional opening spaced apart from the first opening and extending through the case between the mounting face and the fixing face, the additional opening located under a portion of the lead frame that is not opposite to the connecting area of the lead frame, and wherein the semiconductor module further comprises an additional adhesive filling the additional opening so as to bond the circuit block and the lead frame.

3. The semiconductor module according to claim 1, further comprising an adhesive with which the circuit block is fixed to the fixing face of the case, wherein the adhesive filling the opening and the adhesive with which the circuit block is fixed are of the same type.

4. The semiconductor module according to claim 1, wherein a thermal conductivity of the adhesive is higher than a thermal conductivity of the case.

5. The semiconductor module according to claim 1, further comprising a cast resin that fills the case to resin-seal the semiconductor chip, wherein the adhesive is of the same material as the cast resin.

6. The semiconductor module according to claim 1, wherein the adhesive has a higher adhesion force to the lead frame than to the case.

7. The semiconductor module according to claim 1, wherein the lead frame covers the at least one second opening on the internal-mounting-face end of the at least one second opening.

* * * * *